US008420558B2

(12) United States Patent
Tenbrink et al.

(10) Patent No.: US 8,420,558 B2
(45) Date of Patent: Apr. 16, 2013

(54) SUPERCONDUCTING CONNECTION BETWEEN MGB2 SUPERCONDUCTING WIRES VIA A COMPRESSED ELEMENT MADE FROM HTS POWDER

(75) Inventors: Felicitas Tenbrink, Moembris (DE); André Aubele, Hanau (DE); Volker Gluecklich, Hammersbach (DE); Bernd Sailer, Alzenau (DE); Klaus Schlenga, Linkenheim (DE)

(73) Assignee: Bruker EAS GmbH, Hanau (DE)

( * ) Notice: Subject to any disclaimer, the term of this patent is extended or adjusted under 35 U.S.C. 154(b) by 464 days.

(21) Appl. No.: 12/656,869

(22) Filed: Feb. 18, 2010

(65) Prior Publication Data
US 2010/0216645 A1    Aug. 26, 2010

(30) Foreign Application Priority Data
Feb. 21, 2009   (DE) .................. 10 2009 010 011

(51) Int. Cl.
C04B 35/04    (2006.01)

(52) U.S. Cl.
USPC ......... 501/108; 501/96.1; 501/96.3; 505/925; 505/926; 29/599

(58) Field of Classification Search ............... 501/96.1, 501/96.3, 108; 505/925, 926; 29/599
See application file for complete search history.

(56) References Cited

U.S. PATENT DOCUMENTS

| 5,145,835 | A * | 9/1992 | Takeshita et al. | 505/432 |
|---|---|---|---|---|
| 5,290,638 | A * | 3/1994 | Williams et al. | 428/662 |
| 5,521,150 | A * | 5/1996 | Murakami et al. | 505/450 |
| 6,921,865 | B2 | 7/2005 | Morita | |
| 7,226,894 | B2 | 6/2007 | Raber | |
| 2008/0236869 | A1* | 10/2008 | Marte et al. | 174/125.1 |
| 2009/0105079 | A1 | 4/2009 | Leghissa | |

FOREIGN PATENT DOCUMENTS

| DE | 39 05 424 | 2/1994 |
|---|---|---|
| EP | 0 280 812 | 9/1988 |
| EP | 1 276 171 | 1/2003 |
| GB | 2 448 051 | 10/2008 |
| JP | 6 310 189 | 11/1994 |

* cited by examiner

Primary Examiner — Paul Wartalowicz
(74) Attorney, Agent, or Firm — Paul Vincent

(57) ABSTRACT

A method for connecting two or more superconducting wires (1, 2), each comprising at least one filament (3a-3b) that contains $MgB_2$, wherein the superconducting connection is realized through exposed end regions (13) of the filaments (3a-3d) via a superconducting matrix, is characterized in that a bulk powder (4) of a high-temperature superconductor (HTS) powder with a transition temperature of $T_c>40K$ is provided, into which the exposed end regions (13) of the filaments (3a-3d) project, wherein the Boron of the Boron powder of the bulk powder (4) is in amorphous modification, and the bulk powder (4) is compacted together with the projecting exposed end regions (13) of the filaments (3a-3d) to form a compressed element (8). The method improves the quality, in particular, the current carrying capacity and the critical magnetic field strength of a superconducting connection of two $MgB_2$ wires.

12 Claims, 5 Drawing Sheets

SUPERCONDUCTING CONNECTION BETWEEN MGB2 SUPERCONDUCTING WIRES VIA A COMPRESSED ELEMENT MADE FROM HTS POWDER

This application claims Paris Convention of DE 10 2009 010 011.3 filed Feb. 21, 2009 the complete disclosure of which is hereby incorporated by reference.

BACKGROUND OF THE INVENTION

The invention concerns a method for connecting two or more superconducting wires, each comprising at least one filament that contains $MgB_2$, wherein the superconducting connection is realized by exposed end regions of the filaments via a superconducting matrix.

A method of this type is disclosed in U.S. Pat. No. 7,226,894 B2.

Superconducting wires, through which an electric current can flow without loss, are used in a plurality of ways, in particular, for high-field magnet coils. Superconducting materials thereby become superconducting only below a material-specific transition temperature $T_C$ such that superconducting materials must be cooled for technical use. One of the most important superconducting materials in the technical field is NbTi which has a transition temperature of approximately 10K. Since this low transition temperature requires cooling with cryogenic helium (boiling point approximately 4K), the use of NbTi is relatively expensive.

In 2001, superconductivity was discovered in the Mg—B system, which enables relatively inexpensive cooling without cryogenic helium with a transition temperature of approximately 39K for $MgB_2$. For this reason, the operating costs of technical systems could be reduced and the ease of maintenance be increased. $MgB_2$ also has a higher critical magnetic field Bc2 compared to NbTi. For this reason, the superconducting system $MgB_2$ is currently the subject matter of numerous research and development activities.

One difficulty with the technical use of the $MgB_2$ superconducting system is the provision of superconducting connecting points ("joints"), in particular, between two $MgB_2$ superconducting wires. The quality of the superconducting connecting points thereby delimits the efficiency of the overall superconducting system.

U.S. Pat. No. 6,921,865 B2 discloses a joint of two superconducting wires, wherein exposed NbTi filaments of the superconducting wires project into bulk $MgB_2$ powder and are compressed therewith.

DE 39 05 424 C2 describes a method for connecting oxidic superconductors, in which their contact surfaces are thermally melted.

U.S. Pat. No. 7,226,894 B2 discloses a connection between two $MgB_2$ superconducting wires, wherein the $MgB_2$ filaments are exposed at the ends of two superconducting wires and are overlapped. The exposed ends are then heated together with a mixture of boron powder and magnesium powder, wherein boron and magnesium react to form $MgB_2$. The generated $MgB_2$ superconductingly connects the two wires. The generated $MgB_2$ is, however, highly porous and the resulting current carrying capacity of the joint is relatively small.

DE 10 2006 020 829 A1 describes a superconductive joint with superconducting wire conductor leads made from e.g. $MgB_2$. Free conductor lead ends are thereby disposed in a bushing containing bulk $MgB_2$ powder. The bulk powder is subsequently compressed together with the bushing.

EP 0 280 812 B1 discloses various compositions of high temperature superconductors, in particular, of the YBCO-type.

It is the underlying purpose of the invention to improve the quality, in particular, the current carrying capacity and critical magnetic field strength of a superconducting connection of $MgB_2$ superconducting wires.

SUMMARY OF THE INVENTION

This object is achieved by a method of the above-mentioned type, which is characterized in that
a) bulk powder of a high-temperature superconducting (HTS) powder with a transition temperature of $T_C>40K$ is provided, into which the exposed end regions of the filaments project,
b) and the bulk powder is compacted together with the projecting exposed end regions of the filaments to form a compressed element.

In accordance with the present invention, the superconducting connection of the superconducting wires is realized by a compressed element made from HTS material.

The quasi-monolithic compressed element made from HTS material is generated during the connecting process of the superconducting wires.

The HTS powder surrounds the exposed (i.e. the non-superconducting cover is removed) end regions of the $MgB_2$ filaments and fills, in particular, any existing space between the exposed end regions. Compacting the HTS powder reliably produces and solidifies a superconducting path having a high current carrying capacity between the exposed end regions. The HTS material itself is also superconducting at the normal operating temperature of the $MgB_2$ filaments (with a transition temperature of approximately 39K), since it has a higher transition temperature (transition temperature >40K) than the $MgB_2$ filaments.

The HTS powder material is compacted through mechanical compression. Mechanical compression is thereby typically carried out without temperature load or heating. In particular, the temperature remains that low during mechanical compression such that the high-temperature superconducting material (HTS material) does not start to melt. Suitable pressing methods are, in particular, uniaxial pressing and isostatic pressing, in particular cold-isostatic pressing (CIP).

The invention provides in total a simple and inexpensive method for producing high-quality joints for connecting $MgB_2$ superconducting wires, which can be technically realized without problems as a standard industrial procedure.

In one preferred variant of the inventive method, the bulk powder is subjected to uniaxial pressing in step b). Uniaxial pressing is particularly easy to perform.

In one particularly preferred method variant, the compressed element is compacted to at least 30%, preferably at least 40%, preferentially at least 50%, of the theoretical density of the HTS material of the HTS powder in step b). These densities yield particularly high current carrying capacities of the joint.

In one advantageous method variant, the bulk powder additionally contains a binding agent, in particular, a metallic binding agent. The binding agent improves the pressing behavior and/or the solidity of the compressed element. The binding agent in the bulk powder is typically present in the form of powder and preferably comprises metals having good electric conducting properties such as Cu, Ag or Al. When a binding agent is used, the binding agent portion is typically 10 to 70 volume % in the bulk powder.

In one particularly preferred method variant, for step b), the bulk powder is filled into a plastically deformable, in particular, metallic container, and the container is compressed with the bulk powder in step b) such that after compression, the compressed element is tightly enclosed in the container. The likewise compressed container protects the compressed element against mechanical damage, in particular, rupture of the superconducting connection between the superconducting wires in a simple fashion without any additional production step. In accordance with the invention, the plastically deformable container is typically durable at cryogenic temperatures that are required to obtain the superconducting state of the HTS and the $MgB_2$.

In another advantageous method variant, subsequent to step b), the compressed element is introduced into a protective coating, in particular, wherein the compressed element is cast into a plastic resin. The protective coating protects the compressed element against mechanical damage, in particular, against rupture of the superconducting connection between the wires. Compression of the bulk HTS powder can thereby be carried out in any fashion (irrespective of the protective coating). The protective coating can subsequently be adjusted to the compressed element. In accordance with the invention, the protective coating, in particular, the plastic resin, is typically durable at cryogenic temperatures that are required to obtain the superconducting state of the HTS and the $MgB_2$.

In another particularly preferred method variant, the exposed end regions of the filaments of the different superconducting wires are disposed in the bulk powder in such a fashion that they abut each other, in particular, are interwoven with each other. This reduces the danger of badly conducting transitions between the filaments of the different wires and the space between the filaments of different wires is minimized. Mutual abutment of the wires can be ensured in a simple fashion by twisting them together. Twisting together is realized in the simplest fashion as long as the filaments still have their metallic plasticity (i.e. prior to conversion of Mg and B into $MgB_2$).

The present invention also concerns a superconducting joint of two or more superconducting wires, each comprising at least one filament that contains $MgB_2$, characterized in that the superconducting wires are superconductingly connected to each other through exposed end regions of the filaments via a superconducting matrix of a compressed high-temperature superconducting (HTS) powder with a transition temperature of $T_c>40K$. The compressed HTS powder provides a superconducting connection between the superconducting wires at the operating temperature of $MgB_2$. The HTS material and thereby also the entire joint have very good current carrying properties.

In one particularly preferred embodiment of the inventive joint, the HTS material in the HTS powder is a type of layered cuprate, in particular, wherein the HTS material in the HTS powder comprises $YBa_2Cu_3O_X$ or $ReBa_2Cu_3O_X$ or $Bi_2Sr_2CaCu_2O_X$ or $(Bi,Pb)_2Sr_2CaCu_2O_X$ or $(Bi,Pb)_2Sr_2Ca_2Cu_3O_X$, with Re: one or more rare earth elements. These HTS materials have particularly high current carrying properties for joints of $MgB_2$ superconducting wires.

In one preferred embodiment, the superconducting matrix is surrounded by a coating. The coating may have already been provided during compression (container) or also be arranged around the compressed element after compression (protective coating). The coating may, in particular, be formed from metal (e.g. as a metal container) or also comprise a plastic resin into which the superconducting matrix is cast. The coating thereby tightly holds the compressed HTS powder together, thereby safeguarding the superconducting connection and, in particular, preventing rupture of the superconducting connection.

Finally, in one preferred embodiment of the inventive joint, the joint is produced by an inventive method as mentioned above.

Further advantages of the invention can be extracted from the description and the drawing. The features mentioned above and below may be used individually or collectively in arbitrary combination in accordance with the invention. The embodiments shown and described are not to be understood as an exhaustive enumeration but have exemplary character for describing the invention.

The invention is illustrated in the drawing and is explained in more detail with reference to embodiments.

DESCRIPTION OF THE PREFERRED EMBODIMENT

Figure 1:
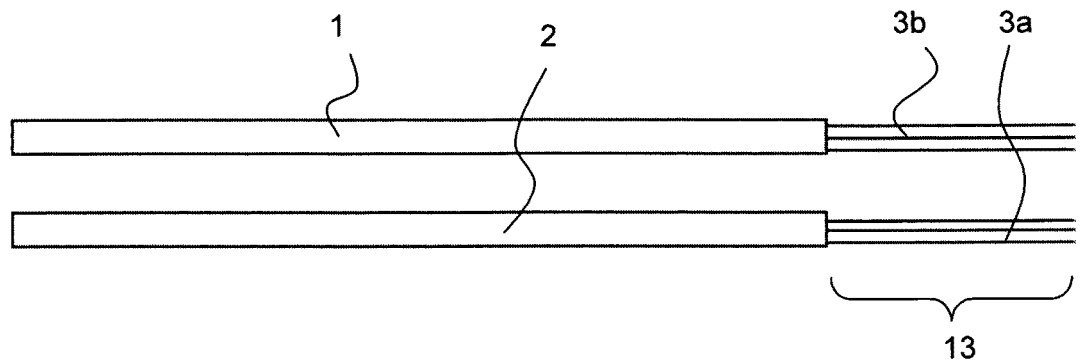
FIG. 1 shows a schematic view of superconducting wires which are to be superconductingly connected in accordance with the inventive method.

FIG. 1 shows two superconducting wires 1, 2, each comprising several filaments 3a, 3b that contain $MgB_2$.

Each filament 3a, 3b is exposed in one end region 13 (in FIG. 1 on the right-hand side). Towards this end, a coating of Monel, Fe, Nb, Ta, Ti, stainless steel, Ni, Cu or Cu alloy has been removed in the end region 13 of the illustrated wires 1, 2, e.g. through etching (exposure may also be realized by other chemical and/or mechanical methods, e.g. grinding or abrasion; it is thereby not absolutely necessary to remove all coatings). The filaments 3a,3b of the two wires 1, 2 shall be superconductingly connected in accordance with the invention (cf. FIGS. 3a to 6). Towards this end, the filaments 3a, 3b of the various wires 1, 2, should be brought into the direct vicinity of each other.

Figure 2:
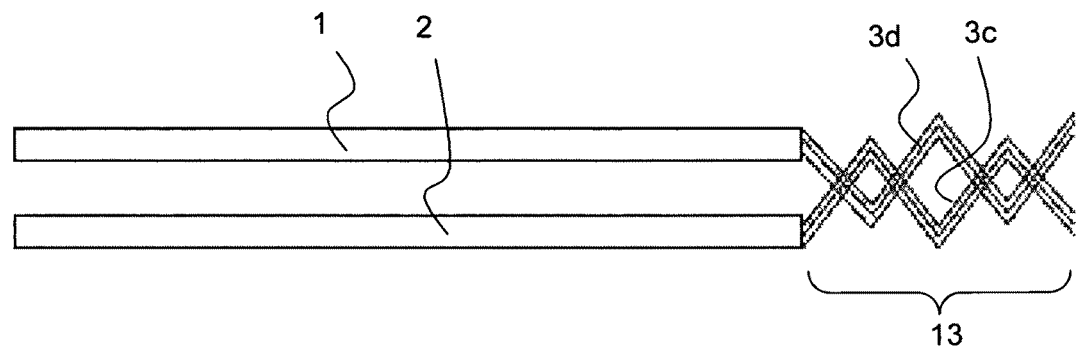
FIG. 2 shows a schematic view of superconducting wires which are to be superconductingly connected in accordance with the inventive method, with twisted together filaments.

FIG. 2 shows, similarly to FIG. 1, two superconducting wires 1, 2, each also comprising several filaments 3c, 3d, which are exposed in an end region 13 and contain $MgB_2$, and being intended to be superconductingly connected in accordance with the invention (cf. FIGS. 3a to 6). In order to improve the electric conduction between the wires 1, 2, in the joint to be produced, the filaments 3c, 3d of the two superconducting wires 1, 2 were twisted together as a preparatory action.

FIGS. 3a to 6 illustrate the inventive production of a joint or an HTS powder compressed element between and around the ends of the two wires 1, 2.

Figure 3A:
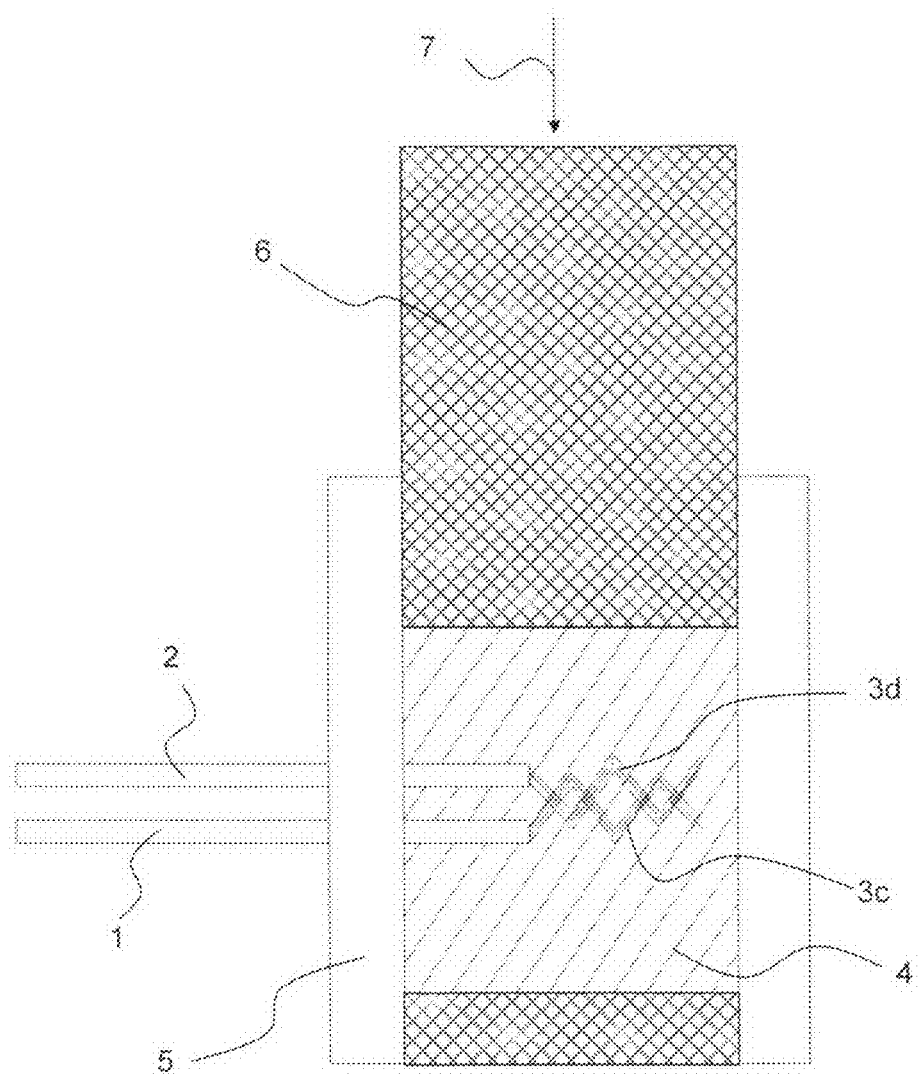
FIGS. 3a, 3b show schematic cross-sectional views of a pressing means for compacting bulk HTS powder in accordance with the invention, with projecting, exposed filaments of two superconducting wires prior to compression (FIG. 3a), and after compression (FIG. 3b)

As is illustrated in FIG. 3a, the exposed end regions of the filaments 3c, 3d of the wires 1, 2 are twisted together and project into the bulk powder 4. The bulk powder fills, in particular, the gaps between the exposed filaments 3c, 3d of the various superconducting $MgB_2$-containing wires 1, 2. The bulk powder 4 substantially consists of fine-grained HTS powder, if necessary, auxiliary materials (e.g. waxes or oils for improving the pressing behavior, or binding agents, in particular, metallic binders to improve the solidity of the compressed element) are also contained. The bulk powder 4 is provided in a pressing mold 5 having an opening in its side wall for the two wires 1, 2.

By lowering a pressing ram 6 in the direction of arrow 7 onto the bulk powder 4, the bulk powder 4 can be mechanically compacted. The pressing ram 6 is typically lowered by a hydraulic or mechanical mechanism providing a force. In the present example, the pressing process is performed without temperature load and does not require any protective gas conditions either.

Figure 3B:
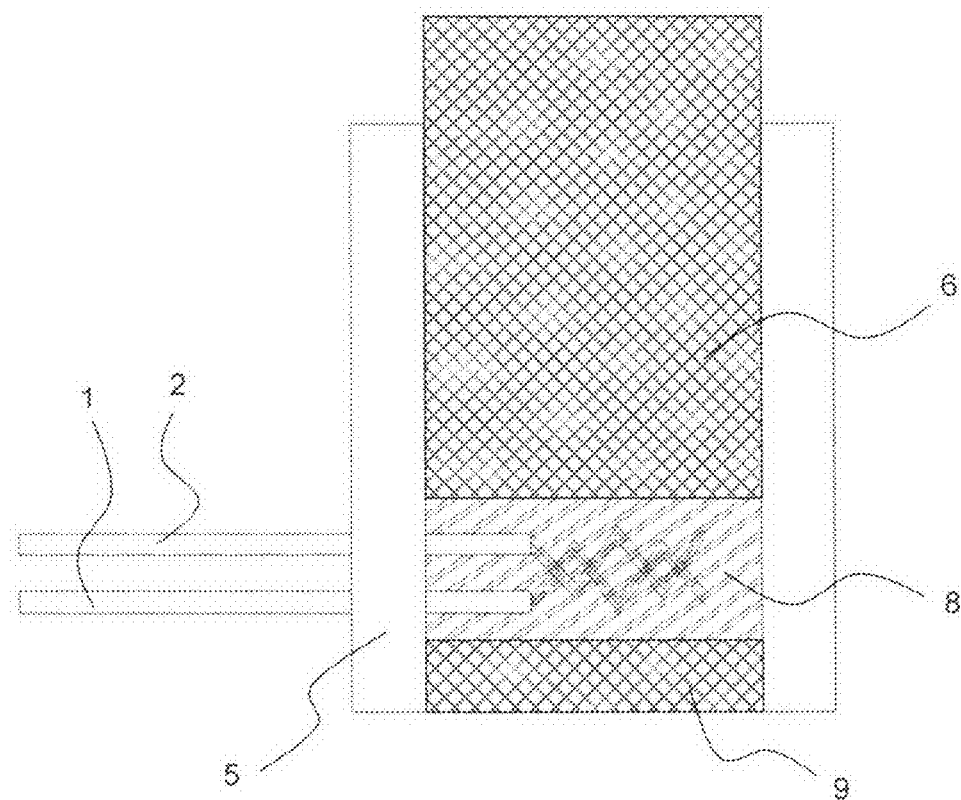

FIG. 3b shows the compressed element (also called green body) 8 after compacting the bulk powder. The pressing ram 6 has been introduced as far as possible into the pressing mold 5. After removal of the pressing ram 6 (and in most cases also of the pressing mold bottom 9), the compressed element 8 can be easily removed.

Figure 4:
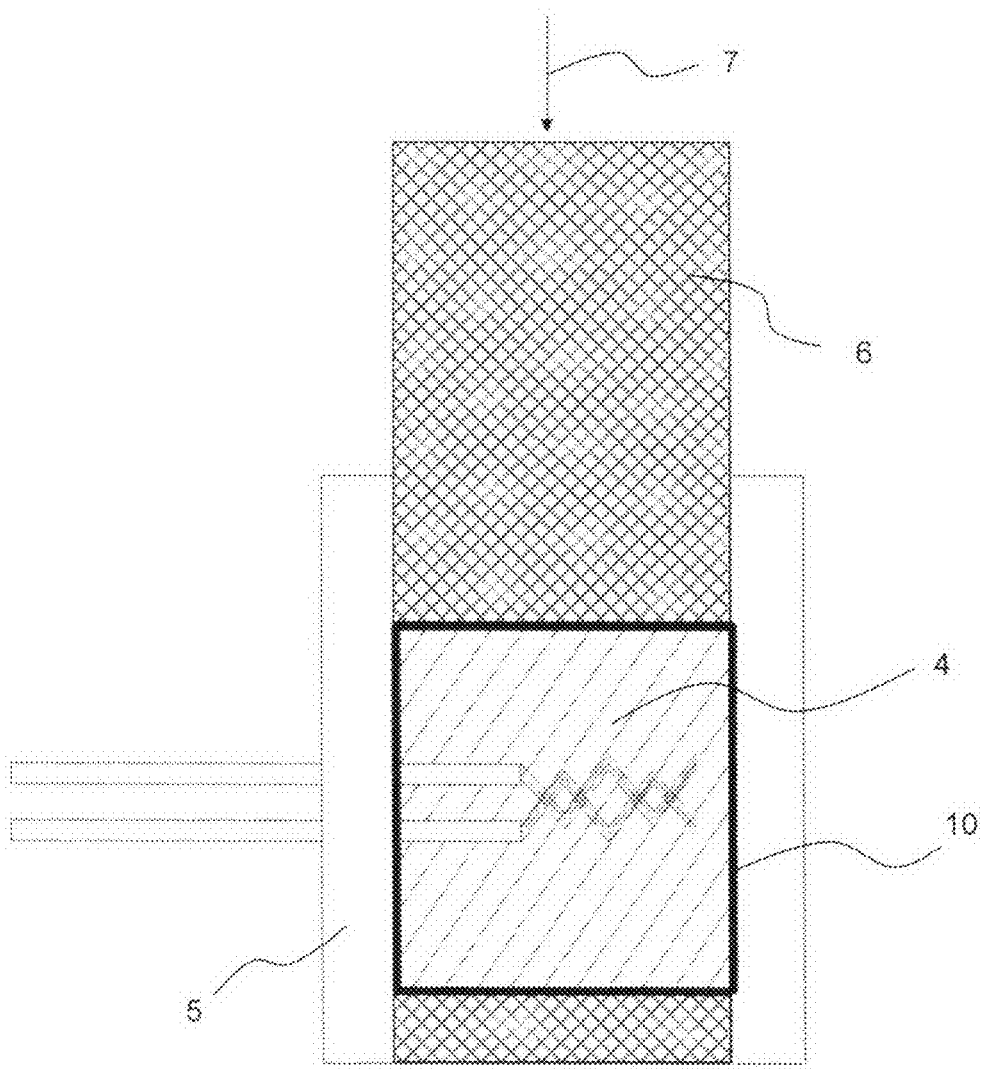
FIG. 4 shows a schematic cross-sectional view of a pressing means for compacting bulk HTS powder in accordance with the invention, with projecting exposed filaments of two superconducting wires, wherein the bulk HTS powder is enclosed in a metal container prior to compacting.

FIG. 4 illustrates an inventive variant of the pressing method illustrated in FIGS. 3a, 3b. The bulk powder 4 of this variant is enclosed in a metallic container 10. The container 10 is also compacted in the mold 5 by the pressing ram 6 that is lowered in the direction of arrow 7.

Figure 5:
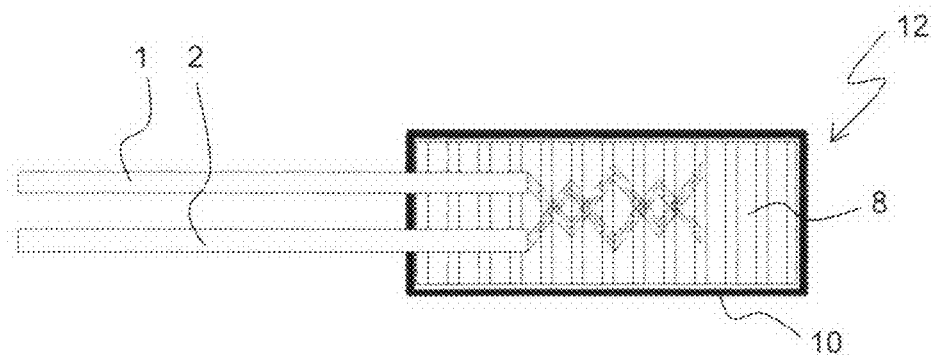
FIG. 5 shows a schematic view of the metal container of FIG. 4 after compacting, with enclosed compressed element.

FIG. 5 shows a joint 12 resulting from the pressing method shown in FIG. 4: The container 10 surrounds the compacted bulk HTS powder, i.e. the compressed element 8, on all sides such that no HTS powder can escape from the inside of the container 10. The wires 1, 2 project from the container 10. The container 10 keeps the compressed element 8 tightly together, thereby ensuring that the superconducting paths generated by the pressing process cannot be ruptured by minor external forces that are exerted during normal handling.

Figure 6:
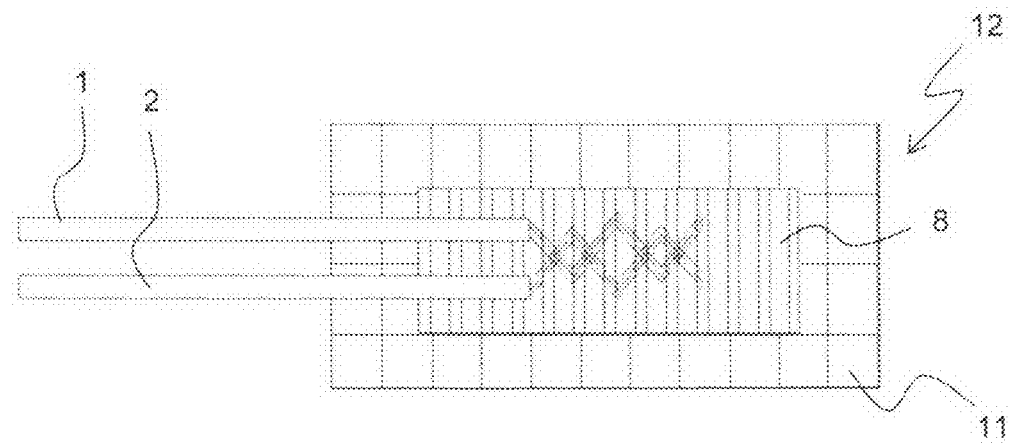
FIG. 6 shows a schematic view of a compressed element that is cast into a plastic resin in accordance with the invention.

FIG. 6 shows a further inventive joint 12 with a protective casing 11 for a compressed element 8 that is obtained e.g. after the pressing process shown in FIG. 3b. After compression, the compressed element 8 was cast into a plastic resin which surrounds the compressed element 8 on all sides as a protective casing 11, thereby keeping the compressed element 8 tightly together. The wires 1, 2 project from the protective casing 11.

We claim:

1. A method for connecting two or more superconducting wires, each wire having at least one filament that contains $MgB_2$, wherein a superconducting connection is realized at exposed end regions of the filaments via a superconducting matrix, the method comprising the steps of:
   a) twisting together exposed end regions of the filaments;
   b) inserting the twisted together end regions of the filaments into a bulk powder, the bulk powder comprising a layered cuprate high-temperature superconductor material (HTS) with a transition temperature of $T_c>40K$; and
   c) compacting the bulk powder together with the twisted together end regions of the filaments to form a compressed element.

2. The method of claim 1, wherein the bulk powder is subjected to uniaxial pressing in step c).

3. The method of claim 1, wherein the compressed element is compacted in step c) to at least 50% of a theoretical density of the HTS material of the HTS powder.

4. The method of claim 1, wherein the bulk powder additionally contains a binding agent or a metallic binding agent.

5. The method of claim 1, wherein in step c), the bulk powder is filled into a plastically deformable or metallic container, and the container is compressed with the bulk powder in step c) such that, after compression, the compressed element is tightly enclosed in the container.

6. A superconducting joint produced by the method of claim 1.

7. The method of claim 1, wherein the compressed element is introduced into a protective casing subsequent to step c).

8. The method of claim 7, wherein the compressed element is cast into a plastic resin.

9. A superconducting joint of two or more superconducting wires, each wire having at least one filament that contains $MgB_2$, wherein the superconducting wires are superconductingly connected through twisted together end regions of the filaments surrounded by a superconducting matrix comprising a compressed, high-temperature superconducting (HTS) powder with a transition temperature of $T_c>40K$, wherein an HTS material in the HTS powder is a layered cuprate.

10. The superconducting joint of claim 9, wherein the HTS material in the HTS powder comprises $YBa_2Cu_3O_x$, $ReBa_2Cu_3O_x$, $Bi_2Sr_2CaCu_2O_x$, $(Bi,Pb)_2Sr_2CaCu_2O_x$ or $(Bi,Pb)_2Sr_2Ca_2Cu_3O_x$, with Re: one or more rare earth elements.

11. The superconducting joint of claim 9, wherein the superconducting matrix is surrounded by a coating.

12. A method for connecting two or more superconducting wires, each wire having at least one filament that contains $MgB_2$, wherein a superconducting connection is realized at exposed end regions of the filaments via a superconducting matrix, the method comprising the steps of:
   a) twisting together exposed end regions of the filaments;
   b) inserting the twisted together end regions of the filaments into a bulk powder, the bulk powder consisting of a layered cuprate high-temperature superconductor material (HTS) with a transition temperature of $T_c>40K$; and
   c) compacting the bulk powder together with the twisted together end regions of the filaments to form a compressed element.

* * * * *